(12) United States Patent
Muthukaruppan et al.

(10) Patent No.: US 9,638,720 B2
(45) Date of Patent: May 2, 2017

(54) LOW POWER CURRENT SENSOR

(71) Applicants: Ramnarayanan Muthukaruppan, Bangalore (IN); Srinivasulu Malepati, Bangalore (IN); Atul Kumar, Bangalore (IN); Santhosh Nen, Bangalore (IN)

(72) Inventors: Ramnarayanan Muthukaruppan, Bangalore (IN); Srinivasulu Malepati, Bangalore (IN); Atul Kumar, Bangalore (IN); Santhosh Nen, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/129,513

(22) PCT Filed: Aug. 26, 2013

(86) PCT No.: PCT/US2013/056616
§ 371 (c)(1),
(2) Date: Dec. 26, 2013

(65) Prior Publication Data
US 2016/0195571 A1   Jul. 7, 2016

(51) Int. Cl.
*G01R 15/14*   (2006.01)
*G01R 19/252*  (2006.01)
*G05F 1/565*   (2006.01)
*G06F 1/26*    (2006.01)

(52) U.S. Cl.
CPC ......... *G01R 15/146* (2013.01); *G01R 19/252* (2013.01); *G05F 1/565* (2013.01); *G06F 1/26* (2013.01)

(58) Field of Classification Search
CPC ....................................................... G05F 1/565
See application file for complete search history.

(56) References Cited

U.S. PATENT DOCUMENTS

| 2010/0326170 | A1* | 12/2010 | Schneider | H03H 17/0671 73/35.01 |
| 2012/0112718 | A1* | 5/2012  | Pons      | G05F 1/575 323/281    |
| 2012/0319677 | A1* | 12/2012 | Bogner    | G01R 1/20 324/126     |
| 2014/0266103 | A1* | 9/2014  | Wang      | G05F 1/462 323/274    |

* cited by examiner

*Primary Examiner* — Albert Wang
(74) *Attorney, Agent, or Firm* — Blakely, Sokoloff, Taylor & Zafman LLP

(57) ABSTRACT

Described is a current sensor comprising: a main resistive branch having a target device coupled to a load at a first node; a replica resistive branch having a replica device which is a replica of the target device, the replica device coupled to a current digital to analog converter (DAC) at a second node; and an analog to digital converter (ADC) coupled directly or indirectly to the first and second nodes, the ADC to generate an output coupled to the current DAC.

21 Claims, 5 Drawing Sheets

LOW POWER CURRENT SENSOR

CLAIM OF PRIORITY

This application claims the benefit of priority of International Patent Application No. PCT/US2013/056616 filed Aug. 26, 2013, titled "LOW POWER CURRENT SENSOR," which is incorporated by reference in its entirety.

BACKGROUND

Typically, to sense and accurately measure current through a device, low input offset comparators operating at Nyquist rate are used. However, such architectures are generally large in area and consume significant power.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
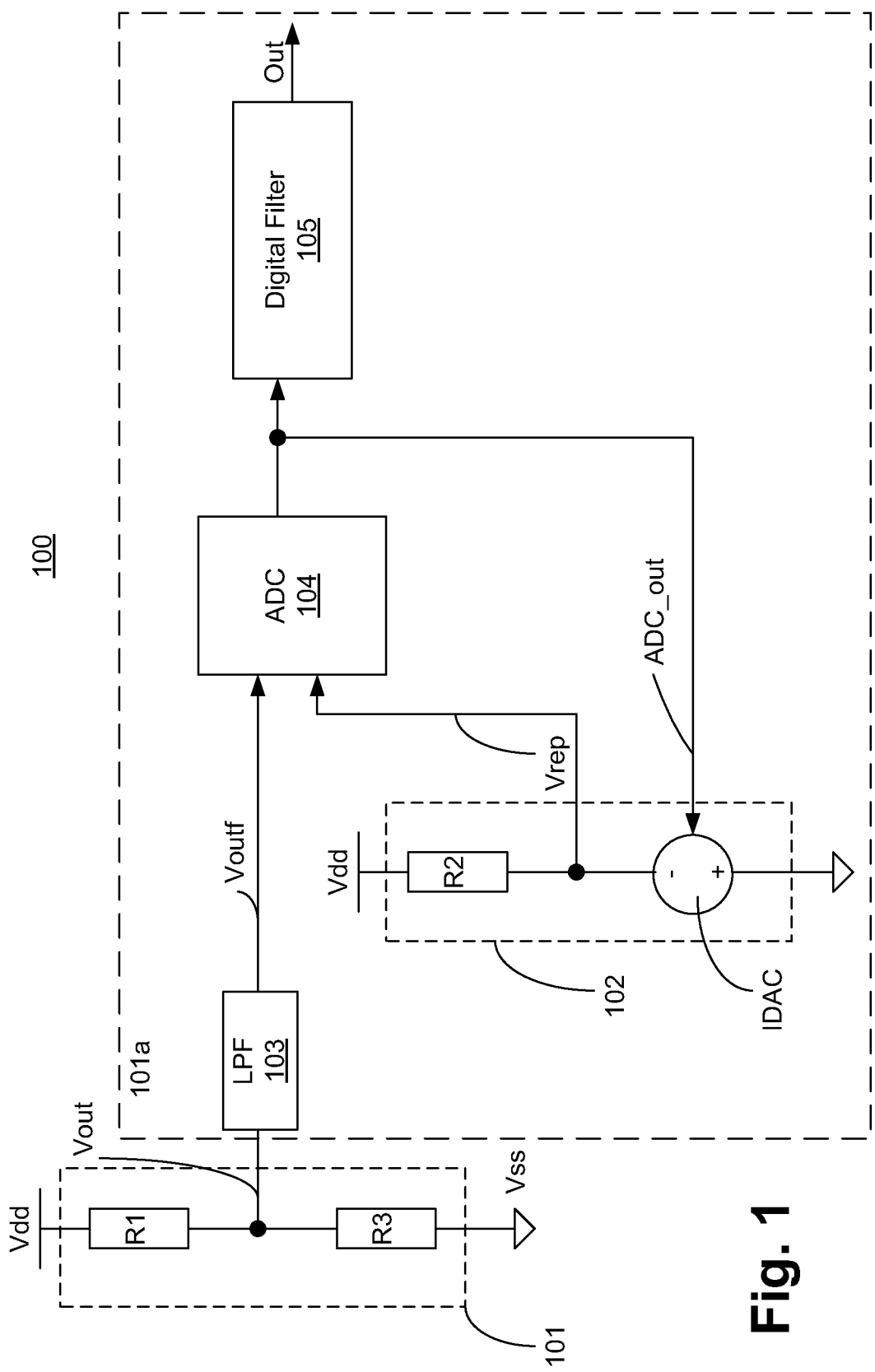
FIG. 1 is a current sensor architecture, according to one embodiment of the disclosure.

The embodiments describe an apparatus to sense current through one or more devices (e.g., transistors). The embodiments use an architecture (i.e., current sensor) with one accurate element (e.g., resistor R2 of FIG. 1) for its operation which reduces the overall area and power consumed by the current sensor compared to traditional current sensing circuits. The embodiments enable measurement of current in any gated power domain. For example, the current sensor can used to sense and measure current for power gates and voltage regulator (VR) based applications.

In one embodiment, average voltage of the sensed circuit block is matched with the average output voltage of a replica block. In one embodiment, by matching the average voltage of the sensed circuit block and maintaining a known ratio between the number of transistors used in the domain that is under measurement and the replica block, current is measured in the power domain of interest. In one embodiment, a sigma-delta modulator output is used to ensure that a single precision current source is switched to make the average voltage of the replica circuit substantially (or exactly) equal to the average voltage of the power domain that is under measurement.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is a current sense architecture 100, according to one embodiment of the disclosure. In one embodiment, architecture 100 comprises a main branch 101 which is the target branch for analysis. In one embodiment, main branch 101 is an output stage of a voltage regulator (VR), where resistor R1 (also called main resistance) represents the resistance of the driving transistor of a low-dropout (LDO) VR, and where resistor R3 is the load resistor. In one embodiment, load is a processor core or a subset of logic. In such an embodiment, current through resistor R1 is sensed and measured by architecture 100. In one embodiment, the current sensing aspect 101a of architecture 100 comprises a replica branch 102, LFP 103 (low pass filter), ADC (analog-to-digital converter) 104, and digital filter 105.

In one embodiment, output Vout of the main branch is filtered by LPF 103 (also called anti-aliasing filter) to generate Voutf. In one embodiment, anti-aliasing filter 103 comprises linear resistor(s) and capacitor(s). In one embodiment, anti-aliasing filter 103 is a single pole low pass RC (resistor-capacitor) filter. In one embodiment, the low pass RC filter has a 3 dB target of 15 MHz to limit the attenuation at 5 MHz and also limit the high frequency switching noise seen at the VR output Vout. In other embodiments, other 3 dB cut off frequencies may be used. In one embodiment, LPF 103 comprises a resistor coupled at one end to node Vout and to node Voutf at the other end, and a capacitor coupled to node Voutf and ground.

The terms node and signals on those nodes are interchangeably used. For example, node Voutf refers to physical node and signal Voutf (or simply Voutf) refers to signal on node Voutf. One technical effect of having the LFP 103 is to reduce high frequency noise on Vout before current is measured. In one embodiment, LPF 103 may be removed and Vout from main branch 101 is directly coupled to ADC 104.

In one embodiment, replica branch 102 comprises a resistor R2 coupled to Vdd and node Vrep. Resistor R2 (also referred to as replica resistor) replicates resistance of resistor R1 and indicates the resistance of a transistor. For example, replica resistor R2 has a resistance which is a scaled version of the resistance of main resistor R1. In one embodiment, replica branch 102 comprises a current digital-to-analog converter (IDAC) coupled in series to resistor R2. In one embodiment, resistor R2 is implemented as one or more transistors coupled in parallel. In one embodiment, IDAC comprises one or more transistors acting as a current source controllable by ADC_out signal which is received at the gate terminal(s) of the one or more transistors. In one embodiment, ADC_out signal is a single bit signal used to modulate Vrep by turning on or off the one or more transistors of IDAC. In one embodiment, ADC_out signal is a multi-bit signal used to modulate Vrep by turning on or off the one or more transistors of IDAC. In one embodiment, these one or more transistors (also called cells) of the IDAC are coupled together in parallel. In one embodiment, output Vrep is also received by ADC 104.

In one embodiment, ADC 104 is a first order sigma-delta ADC. In one embodiment, ADC 104 is a second order sigma-delta ADC. In other embodiments, any order of sigma-delta ADC may be used for ADC 104. In one embodiment, ADC 104 measures current in the replica branch with a sampling rate (e.g., 400 MHz) to generate an output ADC_out. In one embodiment, ADC 104 when combined with digital filter 105 generates a multi-bit output (e.g., 9 bits with a decimation of 40) at a low frequency (e.g., 10 MHz).

In one embodiment, output ADC_out of ADC 104 is filtered by digital filter 105. In one embodiment, ADC_out is a stream of bits (or pulses) from ADC 104 which are filtered by digital filter 105 to reduce noise component in ADC_out. In one embodiment, ADC_out undergoes decimation to reduce signal frequency. In one embodiment, digital filter 105 is one of a cascaded integrated comb (CIC) filter, a finite impulse response (FIR) filter, and infinite impulse response (IIR) filter, or a zero ordered filter. In other embodiments, other filters may be used.

In one embodiment, when voltage on Voutf node is greater than voltage on Vrep node then ADC 104 generates a positive output i.e., ADC_out=1. In such an embodiment, IDAC cells are switched off and voltage on Vrep node is allowed to increase. In one embodiment, when voltage on Voutf node is less than voltage on Vrep node then ADC 104 generates a zero output i.e., ADC_out=0. In such an embodiment, IDAC cells are switched on and voltage on Vrep node is allowed to discharge.

The operation of current measurement is now described. Assuming on the average with DC input conditions that Vout=Vrep. Let 'M' be the total number of cycles for which current measurement is made. Let 'N' be the number of ones generated by ADC 104 i.e., number of times ADC_out is logical 1. In this embodiment, IDAC is assumed to be an n-type device which is turned on when ADC_out is logical 1 and is turned off when ADC_out is logical 0. Let resistor R2 be 'K' times the size of resistor R1 i.e., resistance of resistor R2 (also called R2) is substantially equal to resistance of resistor R1 (also called R1) when resistance R2 is multiplied by 'K.' Let $Vout_{avg}$ be the average value of Voutf and let $Vrep_{avg}$ be the average value of Vrep.

As discussed here, in one embodiment, the feedback loop causes voltage on Vrep node to be substantially equal to voltage on Voutf by turning on/off IDAC overtime. In one embodiment, current through IDAC can be tuned/adjusted (i.e., current through an IDAC current cell). Let Vrep be denoted as Vrefhi when Vrep is logical high, and let Vrep be denoted as Vreflo when Vrep is logical low. When $Vout_{avg}=Vrep_{avg}$, Vrephi and Vreplow are expressed as:

$$Vrephi = VCC \qquad (1)$$

$$Vreplo = VCC - Idac * R2 = VCC - Idac * K * R1 \qquad (2)$$

$$Vrepavg = \frac{(M-N)*VCC + N*(VCC - Idac*K*R1)}{M} \qquad (3)$$

$$Vrepavg = VCC - \frac{N}{M} * Idac * K * R1 \qquad (4)$$

$$Voutavg = VCC - Iloadavg * R1 \qquad (5)$$

Since on the average voltage are equal, $Vout_{avg}=Vrep_{avg}$ $$Iloadavg * R1 = \frac{N}{M} * Idac * K * R1 \qquad (6)$$

$$Iloadavg = \frac{N}{M} * Idac * K \qquad (7)$$

In the embodiments, by measuring the number of times IDAC is turned on by the ADC loop to make the voltage on the replica node equal to the voltage on the Voutf node, current through resistor R1 (i.e., iloadavg) can be estimated accurately.

Let there be 'p' transistors turned on in a voltage regulator to supply current to load R3. In this exemplary embodiment, resistor R1 represents the 'p' transistors. Let there be 'q' transistors turned on in the replica path. In this exemplary embodiment, resistor R2 represents the 'q' transistors. In one embodiment, value of 'q' can be tuned. Let the signal bandwidth of interest be from 0 to 5 MHz, and the anti-aliasing filter 103 have a single pole low pass RC filter with 3 dB target of 15 MHz to limit attenuation at 5 MHz. In this exemplary embodiment, let ADC 104 measure the current in the replica branch 102 with a sampling rate of 400 MHz. Let the filtered output from digital filter 105 be a 9-bit code (i.e., Out is 9 bits wide), then load current (i.e., current estimated through main branch 101) can be derived from equation (7), and expressed as:

$$Iload = \frac{isns<8:0>}{512} * Idac * \frac{p}{q} \qquad (8)$$

In one embodiment, IDAC is multi-bit and controlled by a sigma-delta modulator with multi-bit output.

Figure 2:
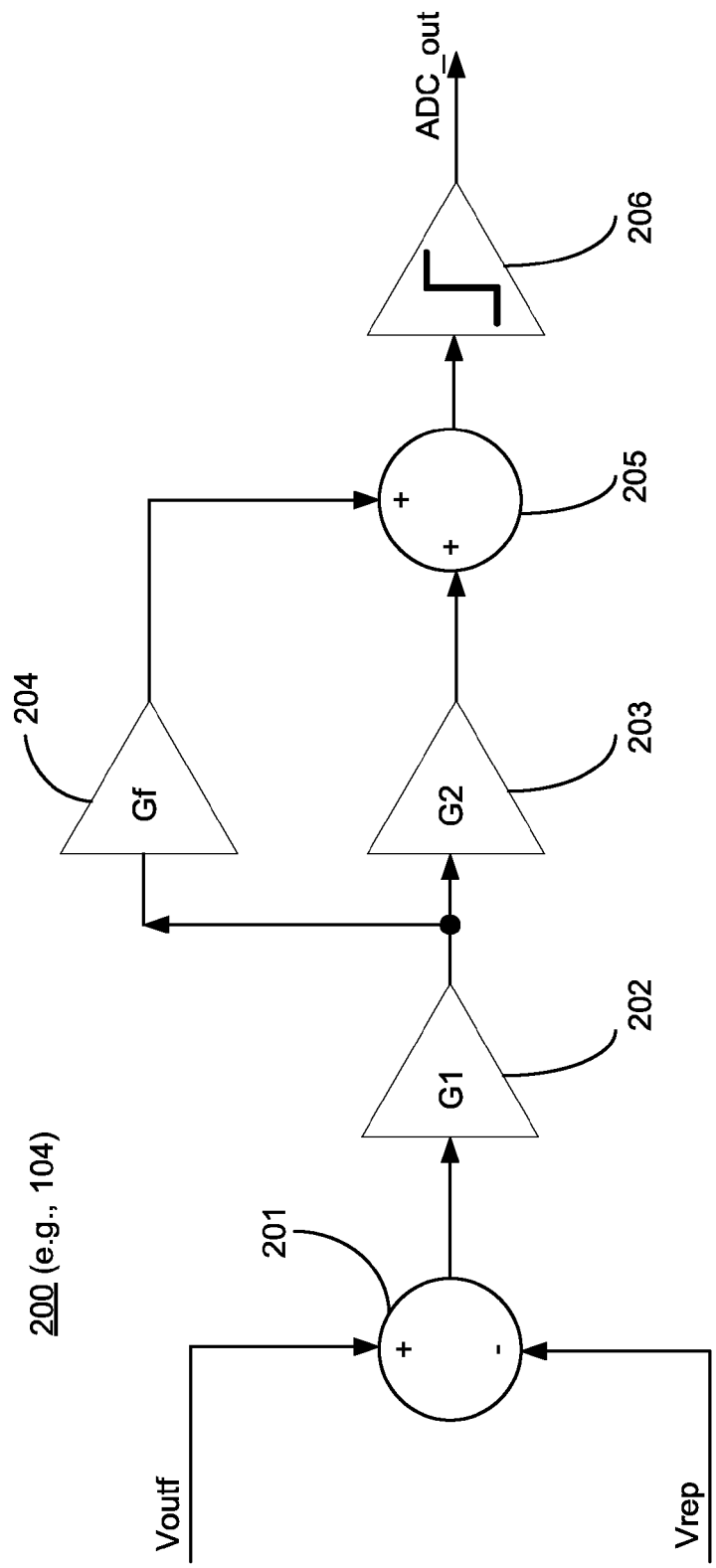
FIG. 2 is a sigma-delta converter for the current sensor architecture, according to one embodiment of the disclosure.

FIG. 2 is a sigma-delta converter 200 for the current sense architecture 100, according to one embodiment of the disclosure. It is pointed out that those elements of FIG. 2 having the same reference numbers (or names) as the elements of any other figure can operate or function in any manner similar to that described, but are not limited to such.

In one embodiment, ADC 104 is implemented as sigma-delta converter 200. In one embodiment, sigma-delta converter 200 comprises comparing unit 201, first integrator 202 with gain G1, second integrator 203 with gain G2, gain stage 204, summer 205, and buffer 206. In one embodiment, G1=1/16, G2=1/8, and Gf=1. In other embodiments, other gain values may be used. In this embodiment, sigma-delta converter 200 is a second order sigma-delta converter. In other embodiments, any order sigma-delta converter can be used to implement ADC 104. In one embodiment, sigma-delta converter 200 uses a two-stage feed-forward architecture with differential sampling. In one embodiment, the differential sampling has a sampling rate of 400 MSPS (mega samples per second). In other embodiments, other sampling rates may be used.

In one embodiment, buffer 106 is a Schmitt triggered buffer. In other embodiments, other hysteric or non-hysteretic comparator buffers may be used to implement buffer 106. In one embodiment, buffer 106 is an ordinary buffer (e.g., series coupled inverters). In one embodiment, the output ADC_out from buffer 206 is a bit stream. In one embodiment, the bit stream is a multi-bit stream. In this embodiment, the bit stream is a stream of single bits which contain signal (i.e., current drawn from power supply rail) and noise due to switching current and discharging of decoupling capacitance.

For this embodiment, peak SNR (signal to noise ratio) of sigma-delta converter 200 is given as:

SNRmax=6.02N+50 log 10(OSR)−11.14 (9)

where, "OSR" is over sampling ratio.

Continuing with the example with reference to FIG. 1, with decimation of 40, SRNmax can be calculated as:

SNRmax=6.02+50 log 10(40)−11.14=74 dB

Figure 3:
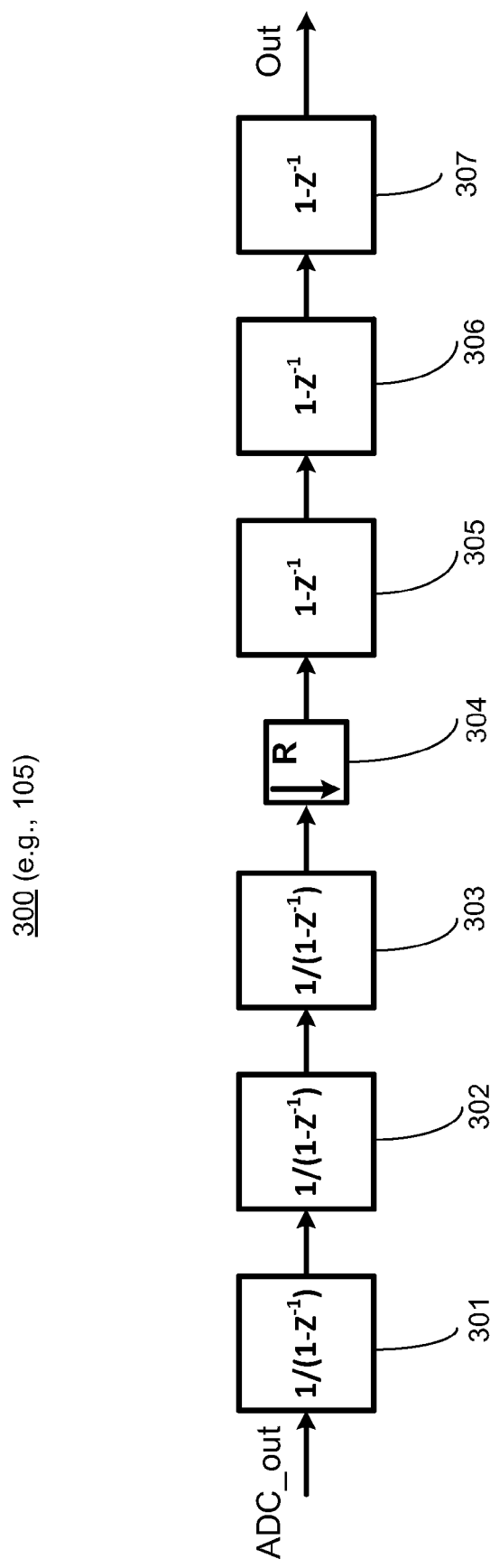
FIG. 3 is a cascaded integrated comb filter for use in the current sensor architecture, according to one embodiment of the disclosure.

FIG. 3 is a cascaded integrated comb filter 300 for use in the current sense architecture, according to one embodiment of the disclosure. It is pointed out that those elements of FIG. 3 having the same reference numbers (or names) as the elements of any other figure can operate or function in any manner similar to that described, but are not limited to such.

In one embodiment, digital filter 105 is implemented as cascaded integrated comb filter 300. In other embodiments, other filters may be used. In one embodiment, cascaded integrated comb filter 300 comprises a first stage 301, a second stage 302, a third stage 303 a window stage 304, a fourth stage 305, a fifth stage 306, and a sixth stage 307 coupled together as shown. In one embodiment, input is received by first stage 301 and output Out is generated by sixth stage 307. In one embodiment, first 301, second 302, and third 303 stages are integrators. In one embodiment, fourth 305, fifth 306, and sixth 307 stages are differentiators. In one embodiment, window stage 304 provides the decimation ratio.

In one embodiment, bit stream ADC_out is filtered by cascaded integrated comb filter 300 to reduce noise components. In one embodiment, transfer function (Y(Z)) of cascaded integrated comb filter 300 is expressed as:

$$Y(Z) = \left[\frac{1-Z^{-R}}{1-Z^{-1}}\right]^N \qquad (10)$$

where 'R' is the size of filter window, and 'N' is the number of stages (in this examples N=6), and where 'Z' indicates a unit delay, e.g., a delay of 1 clock period. In this embodiment, cascaded integrated comb filter 300 is a third order filter. In other embodiments, any order filter may be used to implement digital filter 105. In one embodiment, for every clock period cascaded integrated comb filter 300 adds new incoming sample on ADC_out and removes the Rth sample. In one embodiment, cascaded integrated comb filter 300 is a hardware economic implementation of a windowed averaging filter. In one embodiment, digital filter 105 is an FIR filter with a low pass frequency response and will attenuate the higher frequency quantization noise present in the bit stream from sigma-delta modulator 104.

In one embodiment, Iload (same as iloadavg) information is provided to a power control unit (PCU) which takes any number of actions according to the current level of Iload. In one embodiment, Iload (i.e., estimated current through main branch 101) determined by architecture 100 is used by PCU to limit performance of a processor core when Iload approaches a threshold limit (e.g., a pre-determined threshold).

Figure 4:
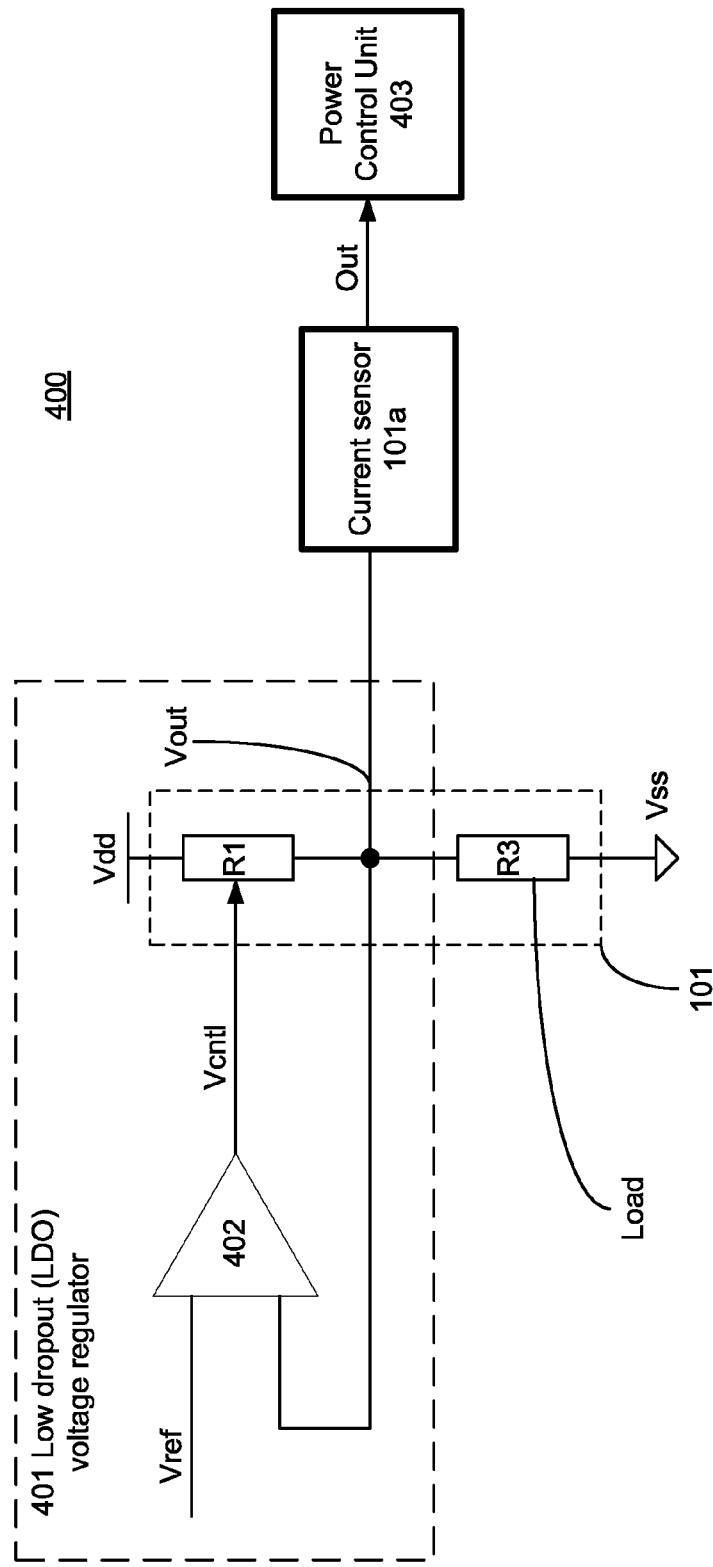
FIG. 4 is a low dropout (LDO) voltage regulator (VR) coupled to the current sensor architecture, according to one embodiment of the disclosure.

FIG. 4 is a circuit 400 including a low dropout (LDO) voltage regulator (VR) coupled to the current sensor architecture, according to one embodiment of the disclosure. It is pointed out that those elements of FIG. 4 having the same reference numbers (or names) as the elements of any other figure can operate or function in any manner similar to that described, but are not limited to such.

In one embodiment, circuit 400 comprises LDO VR 401, current sensor 101a, and power control unit (PCU) 403. In one embodiment, LDO VR 401 comprises amplifier (or comparator) 402 that compares Vref (reference voltage) with the output Vout, and generates a control signal Vcntl to regulate resistance of resistor R1. In one embodiment, resistor R1 comprises one or more transistors coupled in parallel. In one embodiment, Vctrl is a digital signal to turn on/off the one or more of the parallel transistors. In such an embodiment, LDO VR 401 is a digital LDO VR.

In one embodiment, output Vout of LDO VR 401 is received by current sensor 101a to sense current through resistor R1 (i.e., one or more transistors in parallel). In one embodiment, output Out of current sensor 101a is received by PCU 403 which monitors the output to take one or more actions. For example, if the current sensed by current sensor 101a is above a threshold, PCU 403 may establish that load (represented by resistor R3) is drawing current excessively and may be hacked by a virus, for example. PCU 403 in such a case may take precautionary measures to handle the virus. For example, PCU 403 may cause the processor having the load to shut down, or it may protect other vital resources (e.g., memory) coupled to the processor.

Figure 5:
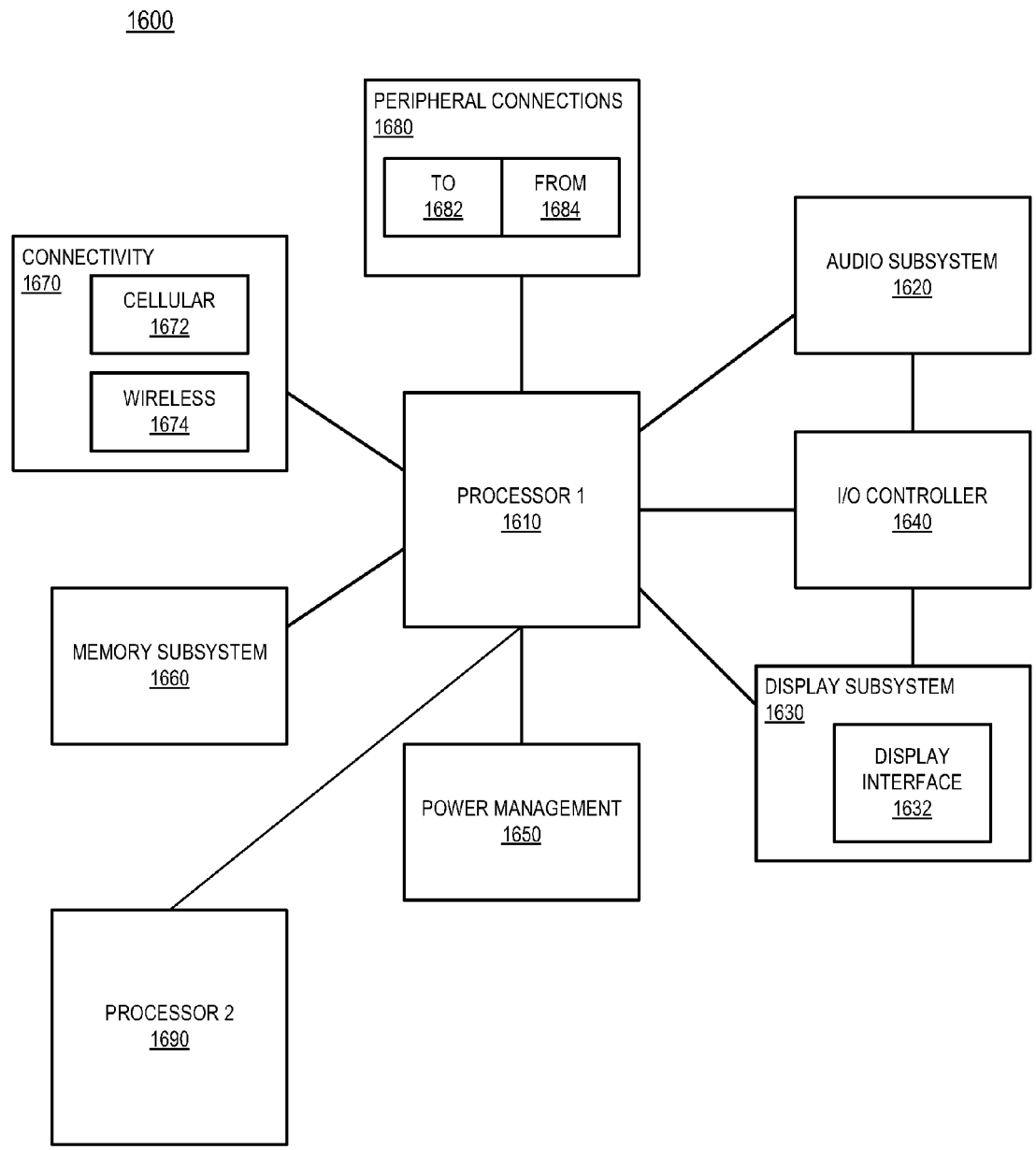
FIG. 5 is a smart device or a computer system or an SoC (system-on-chip) with the current sensor architecture, according to one embodiment of the disclosure.

FIG. 5 is a smart device or a computer system or an SoC (system-on-chip) with the current sense architecture, according to one embodiment of the disclosure. It is pointed out that those elements of FIG. 5 having the same reference numbers (or names) as the elements of any other figure can operate or function in any manner similar to that described, but are not limited to such.

FIG. 5 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with the current sense architecture described with reference to embodiments discussed. Other blocks of the computing device 1600 may also include apparatus of current sense architecture described with reference to embodiments discussed. The various embodiments of the present disclosure may also comprise a network interface within 1670 such as a wireless interface so that a system embodiment may be incorporated into a wireless device, for example, cell phone or personal digital assistant or a wearable device.

In one embodiment, processor 1610 (and/or processor 1690) can include one or more physical devices, such as microprocessors, application processors, microcontrollers, programmable logic devices, or other processing means. While the embodiment shows two processors, a single or more than two processors may be used. In one embodiment, processor 1690 is optional and may be removed. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a main resistive branch having a target device coupled to a load at a first node; a replica resistive branch having a replica device which is a replica of the target device, the replica device coupled to a current digital to analog converter (DAC) at a second node; and an analog to digital converter (ADC) coupled directly or indirectly to the first and second nodes, the ADC to generate an output coupled to the current DAC.

In one embodiment, the target device is a p-type device coupled to a power supply node and the first node. In one embodiment, the replica device is a p-type device coupled to the power supply node and the second node. In one embodiment, the apparatus further comprises an anti-aliasing filter coupled to the first node and the ADC. In one embodiment, the anti-aliasing filter comprises a resistor and a capacitor. In one embodiment, the current DAC comprises an n-type device coupled to the second node and a ground node.

In one embodiment, the ADC is a sigma-delta modulator. In one embodiment, the output of the ADC is a single or multi-bit output. In one embodiment, the apparatus further comprises a digital filter coupled to the output of the ADC. In one embodiment, the digital filter is one of: a cascaded integrated comb (CIC) filter; a finite impulse response (FIR) filter; an infinite impulse response (IIR) filter; or a zero ordered filter.

In another example, a system is provided which comprises a memory unit; a processor, coupled to the memory unit, the processor including an apparatus according to the embodiments of the apparatus discussed above; and a wireless interface for allowing the processor communicate with another device. In one embodiment, the system further comprises a display unit. In one embodiment, the display unit is a touch screen.

In another example, in one embodiment, an apparatus is provided which comprises: a voltage regulator having a power transistor; a load coupled in series with the power transistor at a first node; and a current sensor coupled to the voltage regulator, the current sensor includes: a current digital to analog converter (DAC); and a replica transistor which is a replica of the power transistor, the replica transistor coupled in series with the current DAC at a second node.

In one embodiment, the apparatus further comprises: an analog to digital converter (ADC) coupled directly or indirectly to the first and second nodes, the ADC to generate an output coupled to the current DAC. In one embodiment, the apparatus further comprises an anti-aliasing filter coupled to the first node and the ADC. In one embodiment, the anti-aliasing filter comprises a resistor and a capacitor. In one embodiment, the current DAC comprises an n-type device coupled to the second node and a ground node. In one embodiment, the ADC is a sigma-delta modulator. In one embodiment, the output of the ADC is a single bit output.

In one embodiment, the apparatus further comprises a digital filter coupled to the output of the ADC. In one embodiment, the digital filter is one of: a cascaded integrated comb (CIC) filter; a finite impulse response (FIR) filter; an infinite impulse response (IIR) filter; or a zero ordered filter. In one embodiment, the voltage regulator comprises a low dropout (LDO) regulator. In one embodiment, the load is a processor core.

In another example, a system is provided which comprises: a memory unit; a processor, coupled to the memory unit, the processor including an apparatus according to the embodiments of the apparatus discussed above; and a wireless interface for allowing the processor communicate with another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a main resistive branch having a target device coupled to a load at a first node;
   a replica resistive branch having a replica device which is a replica of the target device, the replica device coupled to a current digital to analog converter (DAC) at a second node; and
   an analog to digital converter (ADC) coupled directly or indirectly to the first and second nodes, the ADC to generate an output coupled to the current DAC to modulate the voltage of the second node to match the voltage of the first node by maintaining a ratio between a number of times the ADC is turned on (N) and a total number of cycles (M).

2. The apparatus of claim 1, wherein the target device is a p-type transistor device coupled to a power supply node and the first node.

3. The apparatus of claim 2, wherein the replica device is a p-type transistor device coupled to the power supply node and the second node.

4. The apparatus of claim 1 further comprises an anti-aliasing filter coupled to the first node and the ADC.

5. The apparatus of claim 1, wherein the current DAC comprises an n-type transistor device coupled to the second node and a ground node.

6. The apparatus of claim 1, wherein the ADC is a sigma-delta modulator.

7. The apparatus of claim 1, wherein the output of the ADC is a single or multi-bit output.

8. The apparatus of claim 1 further comprises a digital filter coupled to the output of the ADC.

9. The apparatus of claim 8, wherein the digital filter is one of:
   a cascaded integrated comb (CIC) filter;
   a finite impulse response (FIR) filter;
   an infinite impulse response (IIR) filter; or
   a zero ordered filter.

10. The apparatus of claim 1, wherein the output is to modulate the voltage of the second node by turning on or off one or more transistors of the current DAC.

11. An apparatus comprising:
    a voltage regulator having a power transistor;
    a load coupled in series with the power transistor at a first node; and
    a current sensor coupled to the voltage regulator, the current sensor includes:
       a current digital to analog converter (DAC);
       a replica transistor which is a replica of the power transistor, the replica transistor coupled in series with the current DAC at a second node, and
       an analog to digital converter (ADC) coupled directly or indirectly to the first and second nodes, the ADC to generate an output coupled to the current DAC to modulating the voltage of the second node to match the voltage of the first node by maintaining a ratio between a number of times the ADC is turned on (N) and a total number of cycles (M).

12. The apparatus of claim 11 further comprises:
    an anti-aliasing filter coupled to the first node and the ADC.

13. The apparatus of claim 12, wherein the ADC is a sigma-delta modulator.

14. The apparatus of claim 12, wherein the output of the ADC is a single bit output.

15. The apparatus of claim 12 further comprises a digital filter coupled to the output of the ADC, wherein the digital filter is one of:
    a cascaded integrated comb (CIC) filter;
    a finite impulse response (FIR) filter;
    an infinite impulse response (IIR) filter; or
    a zero ordered filter.

16. The apparatus of claim 11, wherein the current DAC comprises an n-type transistor device coupled to the second node and a ground node.

17. The apparatus of claim 11, wherein the voltage regulator comprises a low dropout (LDO) regulator, and wherein the load is a processor core.

18. The apparatus of claim 11, wherein the output is to modulate the voltage of the second node by turning on or off one or more transistors of the current DAC.

19. An system comprising:
    a memory unit;
    a processor, coupled to the memory unit, the processor including an apparatus which comprises:
       a main resistive branch having a target device coupled to a load at a first node;
       a replica resistive branch having a replica device which is a replica of the target device, the replica device coupled to a current digital to analog converter (DAC) at a second node; and
       an analog to digital converter (ADC) coupled directly or indirectly to the first and second nodes, the ADC to generate an output coupled to the current DAC to modulate the voltage of the second node to match the voltage of the first node by maintaining a ratio between a number of times the ADC is turned on (N) and a total number of cycles (M); and a wireless interface for allowing the processor communicate with another device.

20. The system of claim 19 further comprising a display unit, wherein the display unit is a touch screen.

21. The system of claim 19, wherein the output is to modulate the voltage of the second node by turning on or off one or more transistors of the current DAC.

* * * * *